(12) United States Patent
Sakamoto et al.

(10) Patent No.: US 6,958,175 B2
(45) Date of Patent: Oct. 25, 2005

(54) FILM FORMING METHOD AND FILM FORMING DEVICE

(75) Inventors: Hitoshi Sakamoto, Takasago (JP); Noriaki Ueda, Kobe (JP); Takashi Sugino, Toyonaka (JP)

(73) Assignee: Kabushiki Kaisha Watanabe Shoko, Tokyo (JP)

( * ) Notice: Subject to any disclaimer, the term of this patent is extended or adjusted under 35 U.S.C. 154(b) by 0 days.

(21) Appl. No.: 10/471,796

(22) PCT Filed: Mar. 28, 2002

(86) PCT No.: PCT/JP02/03071

§ 371 (c)(1),
(2), (4) Date: Sep. 16, 2003

(87) PCT Pub. No.: WO02/080256

PCT Pub. Date: Oct. 10, 2002

(65) Prior Publication Data

US 2004/0083973 A1    May 6, 2004

(30) Foreign Application Priority Data

Mar. 28, 2001 (JP) ............................. 2001-093499

(51) Int. Cl.⁷ ............................................. H05H 1/24
(52) U.S. Cl. ...................... 427/569; 427/576; 427/577; 118/723 R; 118/728

(58) Field of Search ................................. 427/569, 576, 427/577; 118/723 R, 728

(56) References Cited

U.S. PATENT DOCUMENTS

| | | | | |
|---|---|---|---|---|
| 4,869,923 A | * | 9/1989 | Yamazaki | 427/571 |
| 5,316,804 A | * | 5/1994 | Tomikawa et al. | 427/569 |
| 5,320,878 A | * | 6/1994 | Maya | 427/573 |
| 5,846,613 A | * | 12/1998 | Neuville | 427/575 |

FOREIGN PATENT DOCUMENTS

| | | |
|---|---|---|
| JP | 63-83273 A | 4/1988 |
| JP | 64-17867 A | 1/1989 |
| JP | 3-79769 A | 4/1991 |

* cited by examiner

*Primary Examiner*—Bret Chen
(74) *Attorney, Agent, or Firm*—Birch, Stewart, Kolasch & Birch, LLP

(57) ABSTRACT

A plasma 10 is generated within a film formation chamber 2, and mainly a nitrogen gas 11 is excited within the film formation chamber 2. Then, the excited nitrogen gas 11 is reacted with a diborane gas 13 diluted with a hydrogen gas, thereby forming a boron nitride film 15 on a substrate 4. Thus, the boron nitride film 15 excellent in mechanical and chemical resistance, high in thermal conductivity, and having a low relative dielectric constant κ can be formed speedily.

8 Claims, 5 Drawing Sheets

F I G. 4
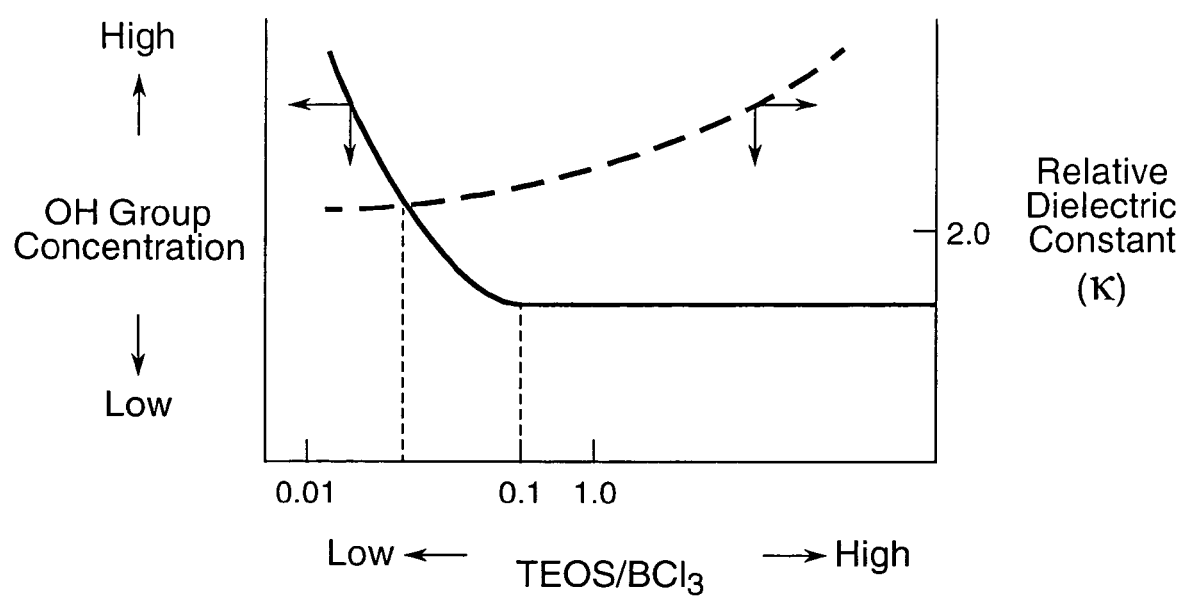

FILM FORMING METHOD AND FILM FORMING DEVICE

This application is the national phase under 35 U.S.C. § 371 of PCT International Application No. PCT/JP02/03071 which has an International filing date of Mar. 28, 2002, which designated the United States of America.

TECHNICAL FIELD

This invention relates to a film forming method and a film forming apparatus for forming a boron nitride film and a boron carbonitride film.

BACKGROUND ART

In an integrated circuit, a silicon dioxide film ($SiO_2$ film) by the plasma CVD (chemical vapor deposition) method has so far been used as an interlayer dielectric film. However, because of high integration of transistors and speeding of a switching action, losses due to capacitance between wirings have posed problems. To eliminate these losses, it is necessary to decrease the relative dielectric constant of the interlayer dielectric film, so that an interlayer dielectric film with a lower relative dielectric constant has been demanded. Under these circumstances, films of organic materials (for example, organosilicon films or films of amorphous carbon incorporating fluorine) can be provided with a very low relative dielectric constant (relative dielectric constant $\kappa=2.5$ or less), but these films have been problematical in mechanical and chemical resistance and thermal conductivity. Adhesion of the films has also presented a problem, and their moisture absorption resistance has been a problem in terms of density.

Under these circumstances, boron nitride (BN) and boron carbonitride (BNC), which are excellent in heat resistance and have a very low relative dielectric constant (relative dielectric constant $\kappa=2.5$ or less), are attracting attention. However, techniques for forming a BN film or a BNC film by the plasma CVD (chemical vapor deposition) method have not been established, and the advent of a film forming method and a film forming apparatus capable of forming a BN film and a BNC film as products is in eager demand.

The present invention has been accomplished in view of the above situations, and its object is to provide a film forming method and a film forming apparatus which can form films of boron nitride and boron carbonitride.

DISCLOSURE OF THE INVENTION

The film forming method of the present invention is characterized by generating a plasma within a film formation chamber, exciting mainly a nitrogen gas within the film formation chamber, and then reacting the excited nitrogen gas with a diborane gas diluted with a hydrogen gas, thereby forming a boron nitride film on a substrate.

Because of this feature, a boron nitride film excellent in mechanical and chemical resistance, high in thermal conductivity, and having a low relative dielectric constant $\kappa$ can be formed speedily.

The film forming method of the present invention is characterized by generating a plasma within a film formation chamber, exciting mainly a nitrogen gas within the film formation chamber, and then reacting the excited nitrogen gas with a diborane gas diluted with a hydrogen gas, and an organic gas, thereby forming a boron carbonitride film on a substrate.

Because of this feature, a boron carbonitride film excellent in moisture-absorption resistance, excellent in mechanical and chemical resistance, high in thermal conductivity, and having a low relative dielectric constant $\kappa$ can be formed speedily.

The film forming method of the present invention is also characterized in that (nitrogen gas/diborane), the ratio between the flow rate of the nitrogen gas and the flow rate of diborane, is set at 0.1 to 10.0, and that the (nitrogen gas/diborane) is set at 0.2 to 1.2.

The film forming method of the present invention is also characterized in that (organic gas/diborane), the ratio between the flow rate of the organic gas and the flow rate of diborane, is set at 0.01 to 1.0. The film forming method of the present invention is also characterized in that the plasma is generated by applying high frequency waves of 1 MHz to 100 MHz and 1 kW to 10 kW, and the temperature of the substrate is set at 200° C. to 400° C.

The film forming apparatus of the present invention is characterized by plasma generation means provided in an upper part of a film formation chamber for generating a plasma within the film formation chamber, a substrate holding portion provided in a lower part of the film formation chamber, nitrogen gas introduction means provided for introducing a nitrogen gas into the film formation chamber, and diborane gas introduction means provided for introducing a diborane gas diluted with a hydrogen gas to the interior of the film formation chamber below the nitrogen gas introduction means.

Because of this feature, a plasma is generated within a film formation chamber, mainly a nitrogen gas is excited within the film formation chamber, and then the excited nitrogen gas is mixed with a diborane gas diluted with a hydrogen gas, to react them, thereby forming a boron nitride film on a substrate. As a result, a boron nitride film excellent in mechanical and chemical resistance, high in thermal conductivity, and having a low relative dielectric constant $\kappa$ can be formed speedily.

The film forming apparatus of the present invention is characterized by plasma generation means provided in an upper part of a film formation chamber for generating a plasma within the film formation chamber, a substrate holding portion provided in a lower part of the film formation chamber, nitrogen gas introduction means provided for introducing a nitrogen gas into the film formation chamber, and means provided for independently introducing a diborane gas diluted with a hydrogen gas, and an organic gas, to the interior of the film formation chamber below the nitrogen gas introduction means.

Because of this feature, a plasma is generated within a film formation chamber, mainly a nitrogen gas is excited within the film formation chamber, and then the excited nitrogen gas is reacted with a diborane gas diluted with a hydrogen gas, and an organic gas, thereby forming a boron carbonitride film on a substrate. As a result, a boron carbonitride film excellent in moisture absorption resistance, excellent in mechanical and chemical resistance, high in thermal conductivity, and having a low relative dielectric constant $\kappa$ can be formed speedily.

BRIEF DESCRIPTION OF THE DRAWINGS

FIG. 4 is a graph illustrating the effect of tetraethoxysilane on moisture absorption properties.

BEST MODE FOR CARRYING OUT THE INVENTION

To describe the present invention in more detail, the invention will be illustrated in accordance with the accompanying drawings.

Figure 1:
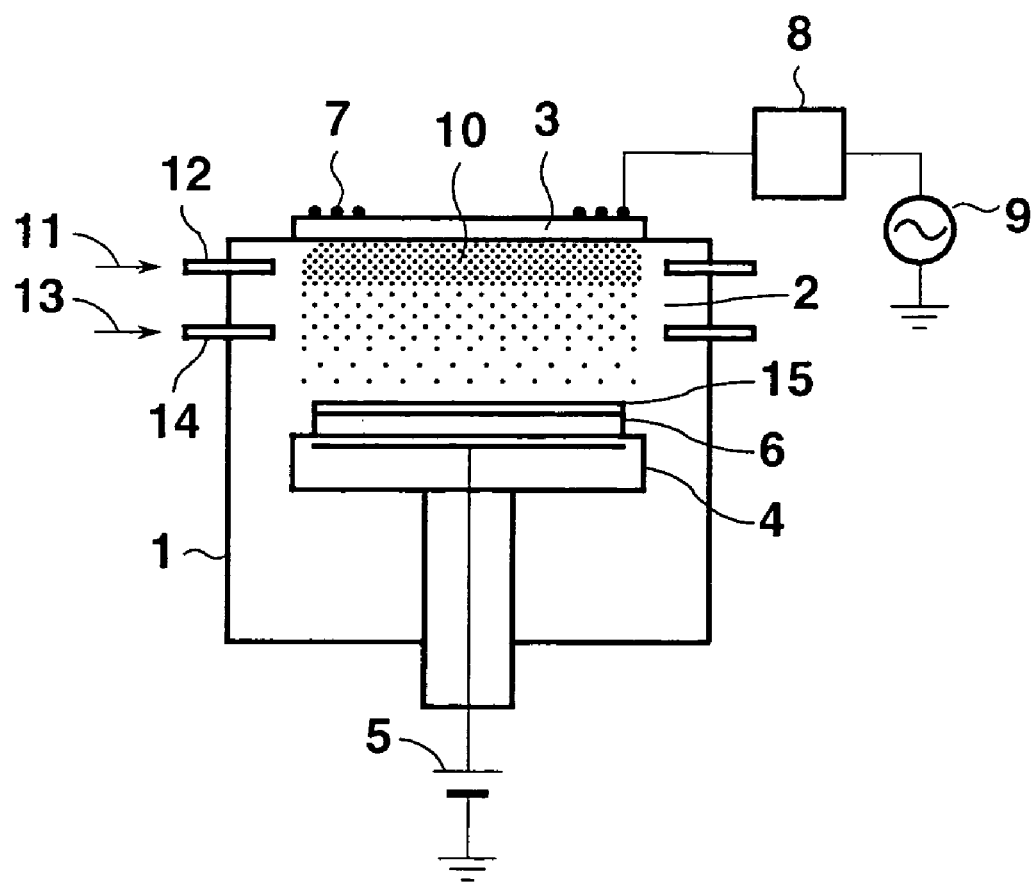
FIG. 1 is a schematic side view of a plasma CVD apparatus as a film forming apparatus for performing a film forming method according to a first embodiment of the present invention.
Figure 2:
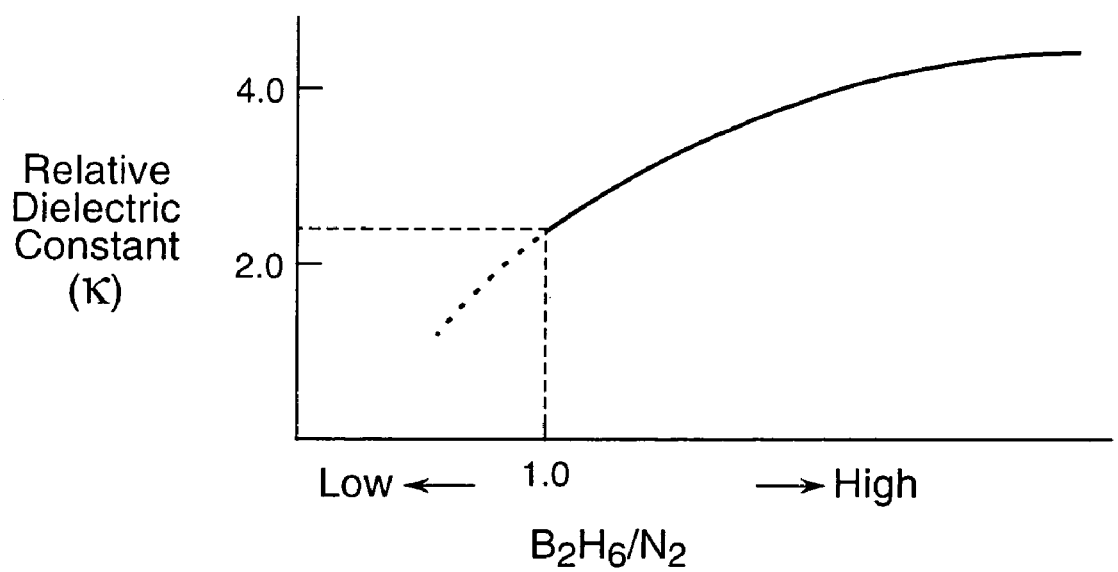
FIG. 2 is a graph representing the relationship between the ratio of diborane to nitrogen and the relative dielectric constant.

The first embodiment is explained based on FIGS. 1 and 2. FIG. 1 schematically shows a side view of a plasma CVD apparatus as a film forming apparatus for performing the film forming method according to the first embodiment of the present invention. FIG. 2 shows a graph representing the relationship between the ratio of diborane to nitrogen and the relative dielectric constant.

As shown in FIG. 1, a film formation chamber 2 is formed within a cylindrical container 1, and a circular ceiling board 3 is provided in an upper part of the container 1. An electrostatic chuck 4, as a substrate holding portion, is provided in the film formation chamber 2 at the center of the container 1. A direct current power source 5 for the electrostatic chuck is connected to the electrostatic chuck 4 so that a substrate 6 of a semiconductor is electrostatically attracted thereto and held thereon.

A high frequency antenna 7 of a circular ring shape, for example, is disposed on the ceiling board 3, and a high frequency power source 9 is connected to the high frequency antenna 7 via a matching instrument 8. By supplying an electric power to the high frequency antenna 7, electromagnetic waves are shot into the film formation chamber 2 of the container 1. The electromagnetic waves shot into the container 1 ionize a gas within the film formation chamber 2 to generate a plasma 10 (plasma generation means).

The container 1 is provided with nitrogen gas nozzles 12, as nitrogen gas introduction means, for introducing a nitrogen gas ($N_2$ gas) 11 (>99.999%) into the film formation chamber 2. Diborane gas nozzles 14, as diborane gas introduction means, are provided for introducing a diborane ($B_2H_6$)-containing gas 13 to the interior of the film formation chamber 2 below the nitrogen gas nozzles 12. The $B_2H_6$-containing gas 13 introduced into the film formation chamber 2 through the diborane gas nozzles 14 is a $B_2H_6$ gas (1% to 5%) diluted with a hydrogen ($H_2$) gas.

With the above-described plasma CVD apparatus, the substrate 6 is placed on the electrostatic chuck 4 and electrostatically attracted thereto. The $N_2$ gas 11 is introduced at a predetermined flow rate through the nitrogen gas nozzle 12, while the $B_2H_6$-containing gas 13 is introduced at a predetermined flow rate through the diborane gas nozzle 14. An electric power is supplied from the high frequency power source 9 to the high frequency antenna 7 to apply high frequency waves (1 MHz to 100 MHz, 1 kW to 10 kW) via the matching instrument 8. As a result, mainly the $N_2$ gas 11 is excited within the film formation chamber 2 to change into a plasma state. After the $N_2$ gas 11 is excited, it is mixed with the $B_2H_6$-containing gas 13 and reacted thereby, whereby a boron nitride (BN) film 15 is formed on the substrate 6. At this time, the temperature of the substrate 6 is set at 200° C. to 400° C.

The resulting BN film 15 was measured for voltage-capacitance, and the relative dielectric constant κ of the film was confirmed to be κ =2.2 to 2.6.

Within the film formation chamber 2, the nitrogen gas nozzle 12 is provided beside the high frequency antenna 7. Thus, mainly the $N_2$ gas 11 is excited and converted into a plasma gas. The plasma gas, and the $B_2H_6$ gas diluted with $H_2$ gas are reacted. Through this reaction, BN and $H_2$ gas or ammonia are formed. The $H_2$ gas or ammonia is discharged to the outside, and the BN film 15 is formed on the substrate 6. If the diborane gas nozzle 14 is disposed beside the high frequency antenna 7 to convert the $B_2H_6$-containing gas 13 into a plasma, boron solidifies and becomes unreactive with nitrogen.

The ranges of the flow rate of the $N_2$ gas 11 from the nitrogen gas nozzle 12 and the flow rate of the $B_2H_6$-containing gas 13 from the diborane gas nozzle 14 are set such that ($N_2$ gas/$B_2H_6$), the ratio of the flow rate of the $N_2$ gas to the flow rate of $B_2H_6$, is 0.1 to 10.0. Preferably, the ranges are set such that ($N_2$ gas/$B_2H_6$) is 0.2 to 1.2. More preferably, the ranges are set such that ($N_2$ gas/$B_2H_6$) is 1.0.

As shown in FIG. 2, if the value of $B_2H_6/N_2$ is large (if the flow rate of the $N_2$ gas is low) with the film thickness being constant, the relative dielectric constant κ is high, and when the value of $B_2H_6/N_2$ is 1.0, the relative dielectric constant κ is 2.2. Thus, the BN film 15 having a very low relative dielectric constant κ of κ=2.2 to 2.6 is formed by setting the flow rate of the $N_2$ gas 11 and the flow rate of the $B_2H_6$-containing gas 13 such that $N_2$ gas/$B_2H_6$ is 0.1 to 10.0 (preferably, 0.2 to 1.2, further 1.0), and generating the plasma 10 under these conditions. If the flow rate of the $N_2$ gas 11 is low, boron solidifies. If the flow rate of the $N_2$ gas 11 is high, no film is deposited.

With the film forming method using the plasma CVD apparatus described above, the BN film 15 excellent in mechanical and chemical resistance, high in thermal conductivity, and having a low relative dielectric constant κ (κ=2.2 to 2.6) can be formed. The use of $B_2H_6$ permits speedy film formation.

Figure 3:
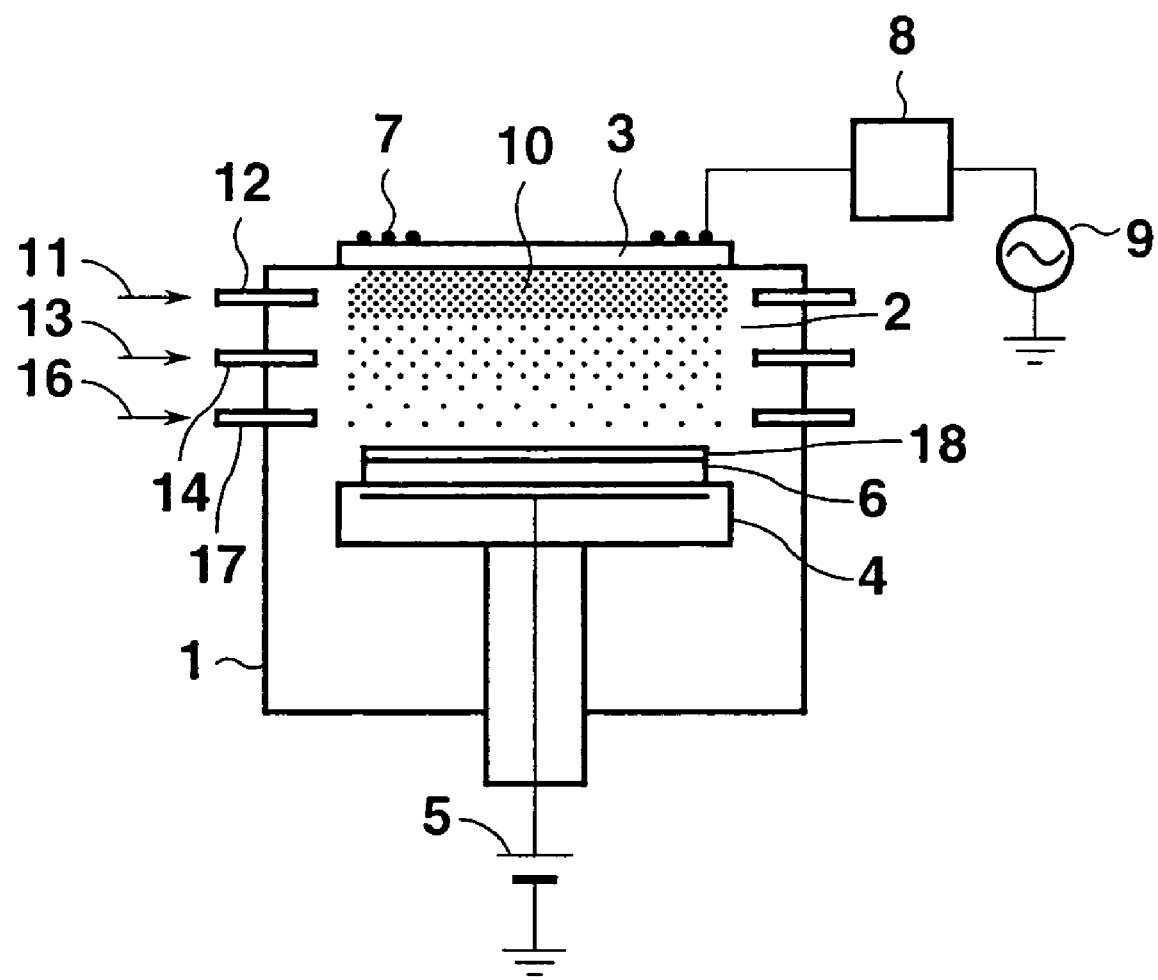
FIG. 3 is a schematic side view of a plasma CVD apparatus as a film forming apparatus for performing a film forming method according to a second embodiment of the present invention.

The second embodiment will be described based on FIGS. 3 and 4. FIG. 3 is a schematic side view of a plasma CVD apparatus as a film forming apparatus for performing the film forming method according to the second embodiment of the present invention. FIG. 4 shows a graph illustrating the effect of tetraethoxysilane on moisture absorption properties. The same members as the members shown in FIG. 1 are assigned the same numerals, and duplicate explanations are omitted.

The container 1 is provided with nitrogen gas nozzles 12 for introducing a nitrogen gas ($N_2$ gas) 11 (>99.999%) into the film formation chamber 2. Diborane gas nozzles 14 and organic gas nozzles 17 are provided for introducing a diborane($B_2H_6$)-containing gas 13 and a tetraethoxysilane (Si(O—$C_2H_5$)$_4$; hereinafter referred to as TEOS) gas (TEOS gas) 16, as an organic gas, to the interior of the film formation chamber 2 below the nitrogen gas nozzles 12. The $B_2H_6$-containing gas 13 introduced into the film formation chamber 2 through the diborane gas nozzle 14 is a $B_2H_6$ gas (1% to 5%) diluted with a hydrogen ($H_2$) gas.

Ethanol or acetone can be employed as the organic gas.

With the above-described plasma CVD apparatus, the $N_2$ gas 11 is introduced at a predetermined flow rate through the nitrogen gas nozzle 12, while the $B_2H_6$-containing gas 13 is introduced at a predetermined flow rate through the diborane gas nozzle 14, and the TEOS gas 16 is introduced at a predetermined flow rate through the organic gas nozzle 17. An electric power is supplied from the high frequency power source 9 to the high frequency antenna 7 to apply high frequency waves (1 MHz to 100 MHz, 1 kW to 10 kW) via the matching instrument 8. As a result, mainly the $N_2$ gas 11 is excited within the film formation chamber 2 to change into a plasma state. After the $N_2$ gas 11 is excited, it is reacted with the $B_2H_6$-containing gas 13 and the TEOS gas 16, whereby a boron carbonitride (BNC) film 18 is formed on the substrate 6. At this time, the temperature of the substrate 6 is set at 200° C. to 400° C.

The resulting BNC film 18 was measured for voltage-capacitance, and the relative dielectric constant κ of the film was confirmed to be κ=2.2 to 2.6.

Within the film formation chamber 2, the nitrogen gas nozzle 12 is provided beside the high frequency antenna 7. Thus, mainly the $N_2$ gas 11 is excited and converted into a plasma gas. The plasma gas reacts with the $B_2H_6$-containing gas 13 and the TEOS gas 16. Through this reaction, BN and $H_2$ gas or ammonia are formed, and the ethyl groups of the TEOS gas 20 are taken up. Consequently, some of the N atoms of BN, a hexagonal crystal structure, are substituted by carbon atoms (C) to form BNC. The $H_2$ gas or ammonia is discharged to the outside, and the BNC film 18 is formed on the substrate 6.

The ranges of the flow rate of the $N_2$ gas 11 from the nitrogen gas nozzle 12 and the flow rate of the $B_2H_6$-containing gas 13 from the diborane gas nozzle 14 are set such that ($N_2$ gas/$B_2H_6$), the ratio of the flow rate of the $N_2$ gas to the flow rate of $B_2H_6$, is 0.1 to 10.0. Preferably, the ranges are set such that ($N_2$ gas/$B_2H_6$) is 0.2 to 1.2. More preferably, the ranges are set such that ($N_2$ gas/$B_2H_6$) is 1.0.

Moreover, the ranges of the flow rates of the $B_2H_6$-containing gas 13 through the diborane gas nozzle 14 and the TEOS gas 16 through the organic gas nozzle 17 are set such that (TEOS/$B_2H_6$), i.e., (organic gas/diborane) which is the ratio of the flow rate of TEOS to the flow rate of $B_2H_6$, is 0.01 to 1.0.

As indicated by a solid line in FIG. 4, it is shown, because of the properties of the BNC film, that if the value of TEOS/$B_2H_6$ increases, say, up to about 0.1, with the film thickness being constant, the concentration of the hydroxyl groups (OH groups) gradually decreases, meaning no moisture absorption (excellent moisture absorption resistance). As indicated by a dashed line in FIG. 4, on the other hand, when the value of TEOS/$B_2H_6$ becomes large, the relative dielectric constant κ is high. Thus, the BNC film 18 excellent in moisture absorption resistance and having a low relative dielectric constant κ is obtained by setting TEOS/$B_2H_6$ at 0.01 to 1.0.

With the film forming method using the plasma CVD apparatus described above, the BNC film 18 excellent in moisture absorption resistance, excellent in mechanical and chemical resistance, high in thermal conductivity, and having a low relative dielectric constant κ (κ=2.2 to 2.6) can be formed with good adhesion, regardless of the type of the film. The use of $B_2H_6$ permits speedy film formation.

Figure 5:
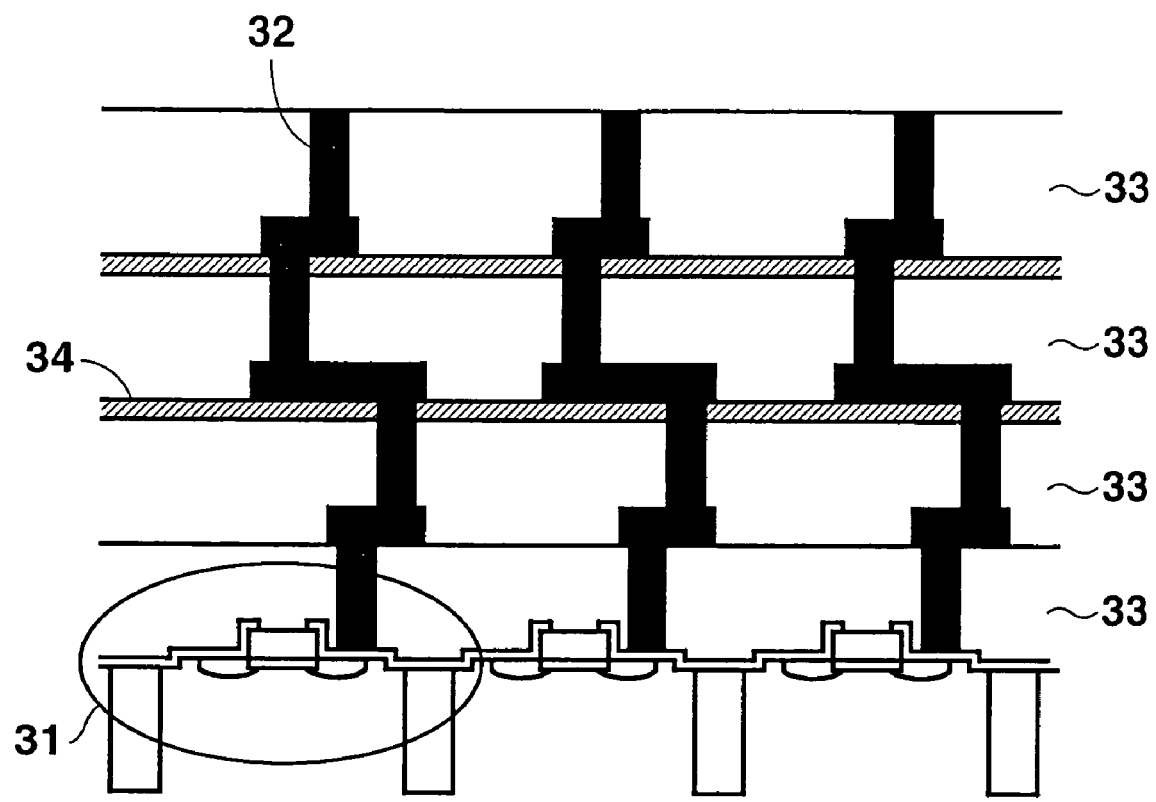
FIG. 5 is a schematic construction drawing of an integrated circuit in which film formation was performed by the film forming method using the plasma CVD apparatus of the present invention.

An example of the application of a BN film or a BNC film, which can be formed by any of the film forming methods using the plasma CVD apparatuses in the above-described first and second embodiments, will be explained based on FIG. 5. FIG. 5 shows a schematic construction of an integrated circuit in which film formation was performed by the film forming method using the plasma CVD apparatus of the present invention.

In a highly integrated circuit (LSI), as shown in the drawing, losses due to capacitance between wirings 32 are eliminated to achieve high integration of transistors 31 and speeding of a switching action. Thus, a film with a low relative dielectric constant is used as an interlayer dielectric film 33 between the wirings 32 during the manufacturing process. An organic coated film or a porous film with a low relative dielectric constant is adopted as the interlayer dielectric film 33.

Further, a BN film or a BNC film is formed as a protective film 34 between the interlayer dielectric films 33. In forming a BN film as the protective film 34, firm formation is performed by the film forming method using the plasma CVD apparatus of the first or third embodiment. In forming a BNC film as the protective film 34, firm formation is performed by the film forming method using the plasma CVD apparatus of the second or fourth embodiment.

The interlayer dielectric film 33, which is an organic coated film or a porous film, has a low relative dielectric constant, but has been problematical in terms of mechanical and chemical resistance and thermal conductivity. Hence, a further film with a low relative dielectric constant is combined as the protective film 34 excellent in mechanical and chemical resistance, high in thermal conductivity and having a low relative dielectric constant. This combination makes it possible to fulfill the demand for the interlayer dielectric film 33 complying with the LSI process, which involves strict processing conditions, while maintaining adhesion and moisture absorption resistance.

The interlayer dielectric film 33, as an organic coated film or a porous film, and the protective film 34 were measured for voltage-capacitance, and the relative dielectric constant κ of <2.2 was confirmed to be obtained.

INDUSTRIAL APPLICABILITY

As described above, the present invention provides the film forming method and the film forming apparatus which can speedily form a boron nitride film excellent in mechanical and chemical resistance, high in thermal conductivity, and having a low relative dielectric constant κ.

What is claimed is:

1. A film forming method characterized by generating a plasma within a film formation chamber having a nitrogen gas nozzle, a diborane gas nozzle, and a high frequency antenna, exciting mainly a nitrogen gas within the film formation chamber by providing the nitrogen gas nozzle closer to the high frequency antenna than is the diborane gas nozzle, and then reacting the excited nitrogen gas with a diborane gas diluted with a hydrogen gas, thereby forming a boron nitride film on a substrate.

2. A film forming method characterized by generating a plasma within a film formation chamber, exciting mainly a nitrogen gas within the film formation chamber, and then reacting the excited nitrogen gas with a diborane gas diluted with a hydrogen gas, and an organic gas, thereby forming a boron carbonitride film on a substrate.

3. The film forming method of claim 1 or 2, characterized in that (nitrogen gas/diborane), a ratio between a flow rate of the nitrogen gas and a flow rate of diborane, is set at 0.1 to 10.0.

4. The film forming method of claim 3, characterized in that the (nitrogen gas/diborane) is set at 0.2 to 1.2.

5. The film forming method of claim 2, characterized in that (organic gas/diborane), a ratio between a flow rate of the organic gas and a flow rate of diborane, is set at 0.01 to 1.0.

6. The film forming method of claim 1, characterized in that the plasma is generated by applying high frequency waves of 1 MHz to 100 MHz and 1 kW to 10 kW, and a temperature of the substrate is set at 200° C. to 400° C.

7. A film forming apparatus characterized by:

plasma generation means provided in an upper part of a film formation chamber for generating a plasma within the film formation chamber;

a substrate holding portion provided in a lower part of the film formation chamber;

nitrogen gas introduction means provided for introducing a nitrogen gas into the film formation chamber; and diborane gas introduction means provided for introducing a diborane gas diluted with a hydrogen gas to an interior of the film formation chamber below the nitrogen gas introduction means.

8. A film forming apparatus characterized by:

plasma generation means provided in an upper part of a film formation chamber for generating a plasma within the film formation chamber;

a substrate holding portion provided in a lower part of the film formation chamber;

nitrogen gas introduction means provided for introducing a nitrogen gas into the film formation chamber; and means provided for independently introducing a diborane gas diluted with a hydrogen gas, and an organic gas, to an interior of the film formation chamber below the nitrogen gas introduction means.

\* \* \* \* \*